United States Patent
Nakaoka et al.

(10) Patent No.: US 6,214,129 B1
(45) Date of Patent: Apr. 10, 2001

(54) CLEANING METHOD WITH HYDROCHLORIC ACID-HYDROGEN PEROXIDE MIXTURE

(76) Inventors: Yasuyuki Nakaoka; Setsuo Wake, both of c/o Mitsubishi Denki Kabushiki Kaisha, 2-3, Marunouchi, 2-chome, Chiyoda-ku,Tokyo 100-8310 (JP); Kazuyuki Kan; Muneyuki Ishimura, both of c/o Shikoku Instrumentation Co., Ltd., 12-56, Wakabamachi, Tadotsucho, Nakatadogun Kagawa (JP)

( * ) Notice: Subject to any disclaimer, the term of this patent is extended or adjusted under 35 U.S.C. 154(b) by 0 days.

(21) Appl. No.: 09/177,114

(22) Filed: Oct. 22, 1998

(30) Foreign Application Priority Data

Dec. 29, 1997 (JP) .................................................. 9-369358

(51) Int. Cl.$^7$ ...................................................... C23G 1/02
(52) U.S. Cl. .................................. 134/3; 134/2; 134/17; 134/19; 134/25.4; 134/26; 134/28; 134/29; 134/30; 134/36; 134/41; 134/902
(58) Field of Search .............................. 134/2, 3, 17, 19, 134/25.4, 26, 28, 29, 30, 36, 41, 902

(56) References Cited

U.S. PATENT DOCUMENTS

| | | | |
|---|---|---|---|
| 3,281,915 | * | 11/1966 | Schramm ................................ 29/25.3 |
| 3,869,313 | * | 3/1975 | Jones et al. ............................. 134/73 |
| 4,808,259 | * | 2/1989 | Jillie, Jr. et al. ...................... 156/643 |
| 5,238,500 | * | 8/1993 | Bergman ................................. 134/3 |
| 5,242,831 | * | 9/1993 | Oki .......................................... 436/5 |

FOREIGN PATENT DOCUMENTS

| | | | |
|---|---|---|---|
| 63077510A | * | 4/1988 | (JP) . |
| 63-77510 | | 4/1988 | (JP) . |
| 3228327 | * | 10/1991 | (JP) . |

OTHER PUBLICATIONS

Ohmi et al. "Total room temp wet cleaning for Si substrate surface". J. Electrochem. Soc. 143(9) 2957–2954, 1996.*

* cited by examiner

Primary Examiner—Sharidan Carrillo
(74) Attorney, Agent, or Firm—Burns, Doane, Swecker & Mathis, LLP

(57) ABSTRACT

A cleaning method to inhibit the adhesion of micro particles to a member to be cleaned by decreasing an amount of generation of bubbles. In a method for cleaning a member to be cleaned by dipping the member into a cleaning bath to which a hydrochloric acid-hydrogen peroxide mixture comprising hydrochloric acid, hydrogen peroxide and water is supplied through a filter and a supplying port; the improvement is that a temperature of the hydrochloric acid, hydrogen peroxide mixture is controlled within the range of 20° to 45° C.

4 Claims, 3 Drawing Sheets

CLEANING METHOD WITH HYDROCHLORIC ACID-HYDROGEN PEROXIDE MIXTURE

FIELD OF THE INVENTION

The present invention relates to a method for cleaning a member to be cleaned such as silicon wafer during a process for producing semiconductor parts by using a hydrochloric acid-hydrogen peroxide mixture.

BACKGROUND OF THE INVENTION

Hitherto, in a process of producing semiconductor parts, for making surface of wafer clean, i.e. without adhesive organic impurities, micro particles and metallic impurities, there are employed a cleaning method and device in which there is used a sulfuric acid-hydrogen peroxide mixture of sulfuric acid and hydrogen peroxide, an ammonia-hydrogen peroxide mixture of aqueous ammonia and hydrogen peroxide, a hydrochloric acid-hydrogen peroxide mixture of hydrochloric acid (HCl) and hydrogen peroxide ($H_2O_2$) and pure water ($H_2O$), or ultrapure water.

Among them, the cleaning method with the hydrochloric acid-hydrogen peroxide mixture is important because metallic impurities such as Al, Fe, Ni, Cr and Cu can be removed, which may cause problems in performances of semiconductor devices such as leakage at junction, threshold voltage, thickness change of oxide film, breakdown of insulating film.

In the above method, though such metallic impurities can be removed, there is a problem that hydrogen peroxide is decomposed to generate bubbles of oxygen and the oxygen bubbles accelerate adhesion of micro particles such as silicon oxide, silicon, metal oxide and organic materials onto a wafer, which results in that a yield of desired device is lowered and, further, reliability of the device is lowered.

The reason why the particles adhere onto the wafer is not apparent but regarded in the followings.

In case of hydrophilic (lyophilic) particles such as silicon oxide, a flow of the hydrochloric acid-hydrogen peroxide mixture becomes turbulent flow due to the difference between a velocity of rising bubbles and a flow velocity of the hydrochloric acid-hydrogen peroxide mixture in which particles are dispersed, and thus when colliding the particles with a wafer, the vector of velocity of the particle to the wafer is increased as compared as in the state of laminar flow without bubbles.

In case of hydrophobic (lyophobic) particles, the hydrophobic particles let their contact surface area with the hydrochloric acid-hydrogen peroxide mixture decrease to be attracted onto the gas-liquid interface of the mixture. On the other hand, an exposed portion of the silicon wafer without oxide film thereon is hydrophobic (lyophobic) and also lets its contact surface area with the hydrochloric acid-hydrogen peroxide mixture decrease to adsorb the bubbles thereon. As a result, the bubbles stay on the exposed surface portion of wafer, and the hydrophobic micro particles are easy to move from the surface of bubbles and adhere onto the exposed wafer surface which is more stable in surface energy.

Then, in JP-A-775510/ 1988, for example, there is disclosed a cleaning method by using the cleaning device as shown in a diagrammatical view of FIG. 1. In FIG. 1, numeral 1 designates a cleaning bath to clean a member to be cleaned such as wafer and the bath contains the hydrochloric acid-hydrogen peroxide mixture. Numeral 2 designates an outside bath into which the hydrochloric acid-hydrogen peroxide mixture is overflowed from the cleaning bath 1, and numeral 3 designates a piping for circulating and supplying the hydrochloric acid-hydrogen peroxide mixture. Numeral 4 designates a pump for circulating the hydrochloric acid-hydrogen peroxide mixture and numeral 5 designates a filter for removing the particles contained in the hydrochloric acid-hydrogen peroxide mixture. Numeral 7 designates a supplying port and numeral 8 designates a discharging port. The hydrochloric acid-hydrogen peroxide mixture in the outside bath 2 is cleaned by the filter 5 and returned into the cleaning bath 1.

According to the technical method described in the above-mentioned publication, means 6 for trapping bubbles is provided between the filter 5 and a supplying port 7 to decrease an amount of bubbles which come into the cleaning bath 1.

By the method, however, the generation of oxygen due to decomposition of hydrogen peroxide cannot be sufficiently inhibited and the adhesion of micro particles onto the exposed surface portion of wafer cannot be prevented.

Then, an object of the present invention is to provide a cleaning method in which the adhesion of micro particles onto a member to be cleaned can be prevented by decreasing an amount of generation of bubbles.

SUMMARY OF THE INVENTION

According to the present invention, in a method for cleaning a member to be cleaned by dipping the member into a cleaning bath to which a hydrochloric acid-hydrogen peroxide mixture comprising hydrochloric acid, hydrogen peroxide and water is supplied through a filter and a supplying port;

the improvement comprises that a temperature of the hydrochloric acid-hydrogen peroxide mixture is controlled within the range of 20° to 45° C.

In the case, it is preferable that means for trapping bubbles in the hydrochloric acid-hydrogen peroxide mixture is provided at least between the filter and the supplying port.

Also, it is preferable that a pressure in the cleaning bath is more than 1 atm.

Further, it is preferable that a ratio of X/Y is not higher than 0.1 in which X is a total volume of bubbles generated per minute while the member to be cleaned is dipped in the hydrochloric acid-hydrogen peroxide mixture and Y is an amount of the hydrochloric acid-hydrogen peroxide mixture in the cleaning bath.

DETAILED DESCRIPTION

The present invention relates to a method for cleaning a member to be cleaned by dipping the member into a cleaning bath to which a hydrochloric acid-hydrogen peroxide mixture comprising hydrochloric acid, hydrogen peroxide and water is supplied through a filter and a supplying port, in which a temperature of the hydrochloric acid-hydrogen peroxide mixture is controlled within the range of 20° to 45° C.

As a result of various studies with respect to the method for cleaning the member to be cleaned by dipping the member into the hydrochloric acid-hydrogen peroxide mixture, the present inventors found that bubbles are hard to be generated in case where a temperature of the hydrochloric acid-hydrogen peroxide mixture is controlled within the range of 20° to 45° C., and have completed the present invention.

Figure 2:
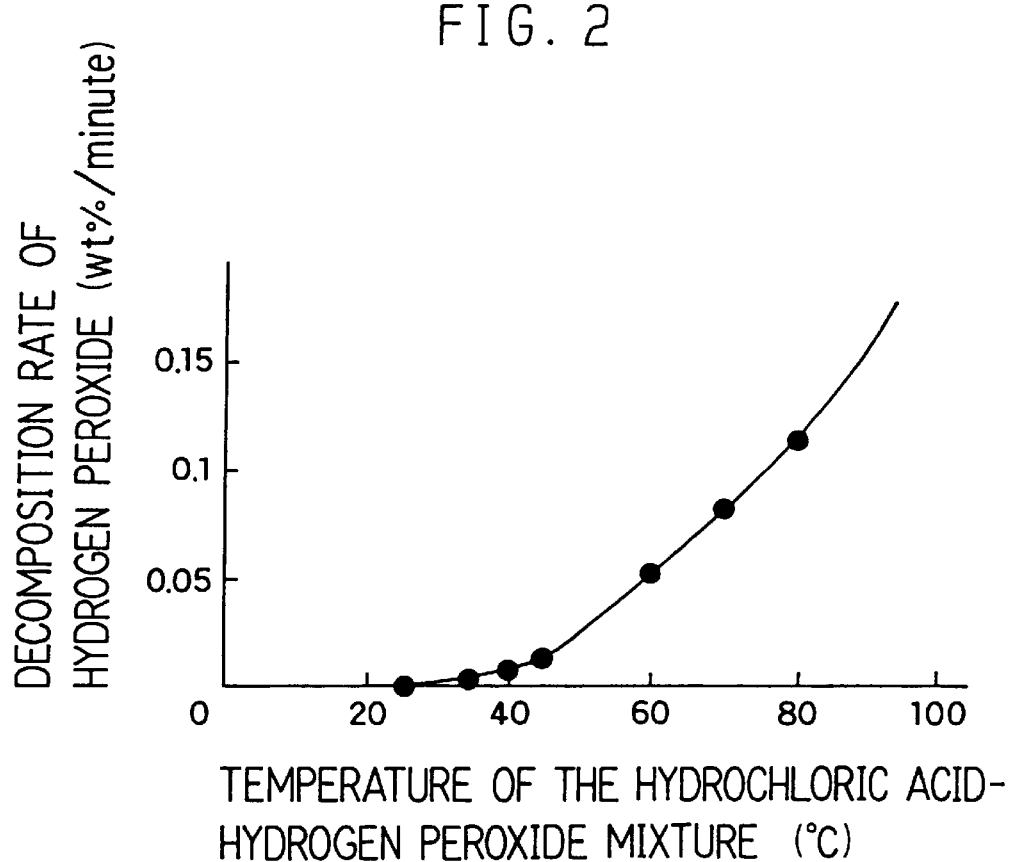
FIG. 2 shows a graph of the relation between a temperature of the hydrochloric acid-hydrogen peroxide mixture and a decomposition rate of hydrogen peroxide.

FIG. 2 shows the relation between the temperature of the hydrochloric acid-hydrogen peroxide mixture (36 wt % aqueous hydrochloric acid solution: 30 wt % aqueous hydrogen peroxide solution: water=1:1:1 (volume ratio)) and the decomposition rate of hydrogen peroxide in the hydrochloric acid-hydrogen peroxide mixture at that temperature. The decomposition rate is calculated from an amount of decomposed hydrogen peroxide during 30 minutes after admixing hydrogen peroxide to the hydrochloric acid-hydrogen peroxide mixture. FIG. 2 shows the facts that hydrogen peroxide is highly sensitive to the temperature of the hydrochloric acid-hydrogen peroxide mixture and that when the temperature goes higher than 45° C., the decomposition rate increases to generate a large amount of bubbles, and thus the micro particles are easy to adhere onto surface of the member to be cleaned. Also, in case of lower than 20° C., it is not preferable because the essential performance of the hydrochloric acid-hydrogen peroxide mixture cannot be sufficiently exhibited though hydrogen peroxide is scarcely decomposed so that an amount of generated bubbles is remarkably low and the micro particles less adhere onto the member to be cleaned. Namely, the metallic impurities such as Al, Fe, Ni, Cr and Cu cannot be removed enough.

When preparing the hydrochloric acid-hydrogen peroxide mixture, the temperature of the resulting mixture rises. Therefore the temperature of the hydrochloric acid-hydrogen peroxide mixture is preferably within the range of 35° to 45° C. from a viewpoint that a cooling system is not required. Further, the treatment (dipping) is preferably carried out within a short period of time because an amount of micro particles adhered becomes large with lapse of treating time. In order to remove the metallic impurities sufficiently within such a short period of time, the treatment is preferably carried out at a higher temperature range, i.e. the range of 40° to 45° C. where a chemical reaction rate is high; while inhibiting the adhesion of the micro particles.

Here, the hydrochloric acid-hydrogen peroxide mixture used in the present invention is a mixture of hydrochloric acid, hydrogen peroxide and water, which is used for cleaning a member to be cleaned such as wafer in semiconductor parts producing process.

A mixing ratio of the hydrochloric acid-hydrogen peroxide mixture is not particularly limited and may be a ratio usually employed in the field of the present invention. From the viewpoint of controlling the concentration of the hydrochloric acid-hydrogen peroxide mixture, 0 to 2 parts by volume (hereinafter, referred to as "part") of 30 wt % aqueous hydrogen peroxide solution and 1 to 20 parts of water are preferably mixed per 1 part of 36 wt % aqueous hydrochloric acid solution. And from the viewpoint of preventing generation of bubbles, 0 to 1 part of 30 wt % aqueous hydrogen peroxide solution and 5 to 20 parts of water are more preferably mixed per 1 part of 36 wt % aqueous hydrochloric acid solution.

Examples of the member to be cleaned are, for instance, silicon wafer, wafer of chemical compound semiconductor such as gallium-arsenic semiconductor, glass substrate and the like.

Figure 1:
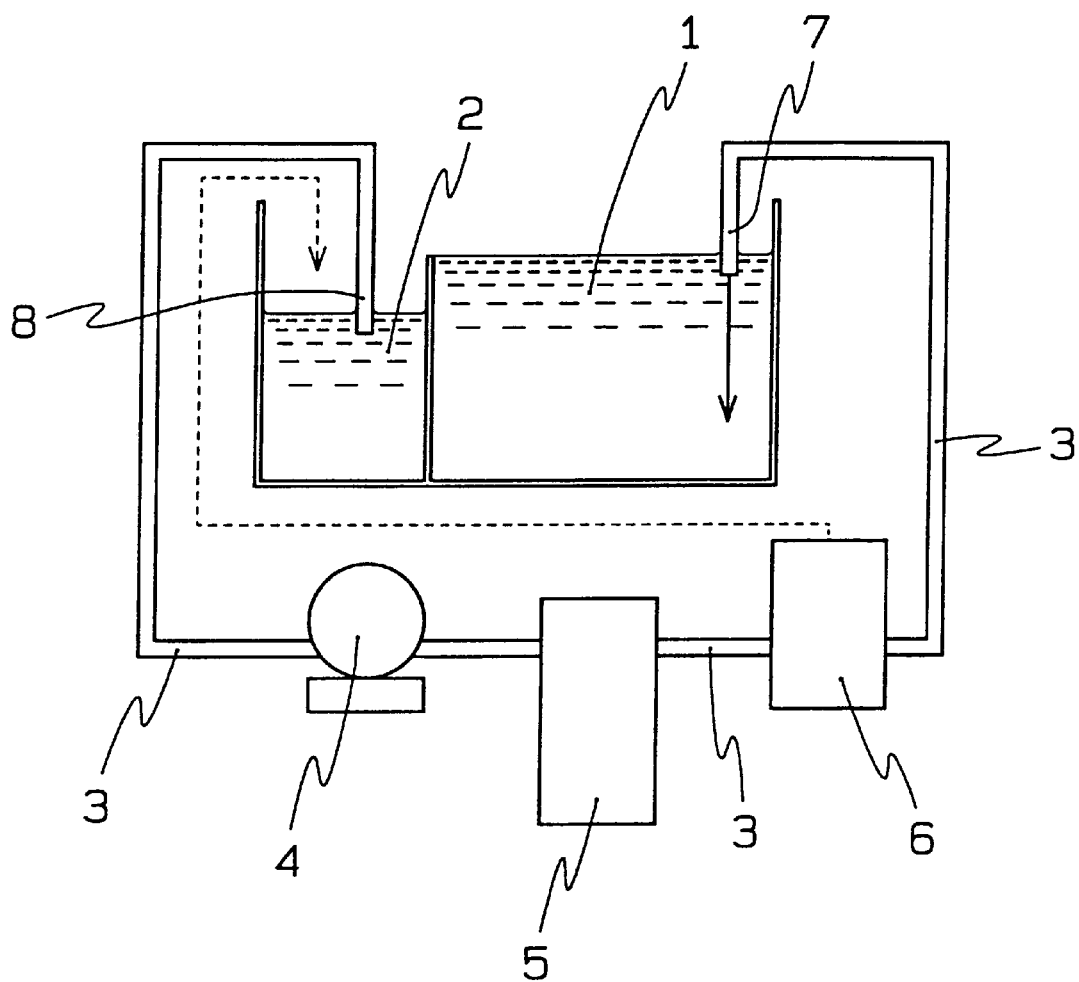
FIG. 1 shows a diagrammatical view of an embodiment of a known conventional cleaning system which is used for carrying out the method of the present invention.

In the present invention, the bubble-trapping means 6 is provided at least between the filter 5 and the supplying port 7 as shown in FIG. 1 since a pressure at the outflow side of the filter, through which the hydrochloric acid-hydrogen peroxide mixture passes, is lower than that at the inflow side of the filter and bubbles are easier to be generated at the outflow side. In this case, the bubble-trapping means may be provided at an optional position in the cleaning system and two or more of the means may be provided.

Particularly in case of using the cleaning system with the outside bath into which overflowed hydrochloric acid-hydrogen peroxide mixture is introduced as shown in FIG. 1, it is preferable to additionally provide a bubble-trapping means between the filter and the discharging port 8 of hydrochloric acid-hydrogen peroxide mixture, from the viewpoint of preventing the filter from drying.

As the bubble-trapping means, conventional one may be used.

It is noted that bubbles collected by the bubble-trapping means may be discharged in the atmosphere.

Figure 3:
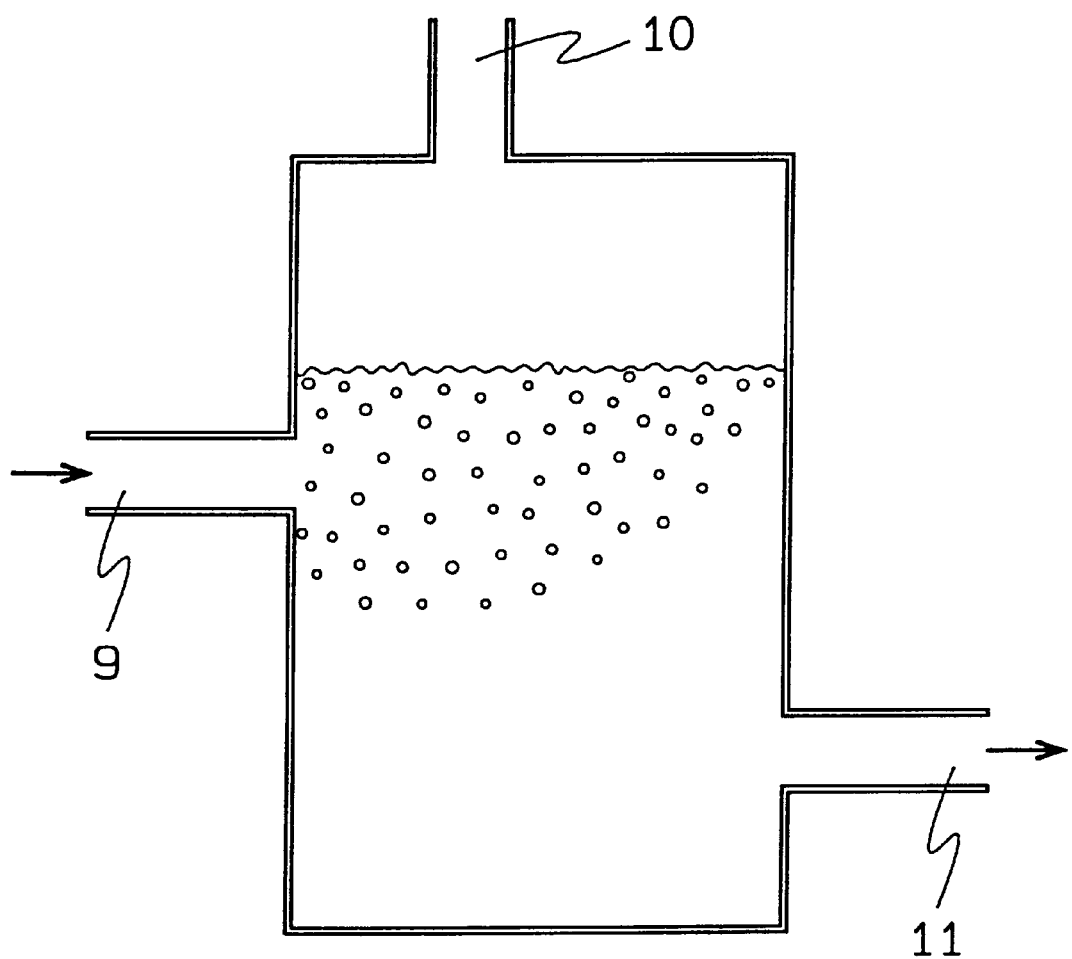
FIG. 3 shows a schematical cross-sectional view of the most preferable means for trapping bubbles.

A schematical cross-sectional view of the most general and preferable embodiment of the bubble-trapping means is shown in FIG. 3.

In FIG. 3, numeral 9 designates a connecting port which communicates with the piping 3 (FIG. 1) and through the port 9 the hydrochloric acid-hydrogen peroxide mixture containing bubbles flows into the bubble-trapping means 6. Numeral 10 designates a gas outlet port and through the port 10 the bubbles from the hydrochloric acid-hydrogen peroxide mixture are exhausted. The hydrochloric acid-hydrogen peroxide mixture with decreased bubbles returns to the piping 3 through an opposite connecting port 11.

A pressure in the cleaning bath may be the atmospheric pressure (1 atm) and preferably is higher than 1 atm from the viewpoint of decreasing an amount of generation of bubbles. Further, a pressure in the cleaning bath is more preferably 1 to 2 atm from the viewpoint of improvement in circulating performance of the hydrochloric acid-hydrogen peroxide mixture and in throughput of the system.

Controlling of the pressure in the cleaning bath, for example, may be carried out by providing a lid onto the upper portion of the bath, sealing with the lid during the treatment of the wafer and introducing a pressurized air from factory pipe (about 5 atm) or bomb (about 8 atm) through a regulator.

Also, at that time, for making it easy to control the pressure in the bath, a valve may be provided with the piping and the valve may be closed, if necessary.

When X is a total volume of bubbles generated per minute during the member to be cleaned is dipped in the hydrochloric acid-hydrogen peroxide mixture and Y is an amount of the hydrochloric acid-hydrogen peroxide mixture in the cleaning bath, the present inventors found the facts that an amount of adhered micro particles can be reduced as a ratio of X/Y is decreased and that an amount of adhered micro particles is remarkably increased when the ratio of X/Y becomes higher than 0.1. From the result of the experiment, the ratio of X/Y is preferably not higher than 0.1. Further, the ratio of X/Y is more preferably not higher than 0.05 from the viewpoint of ensuring a high yield even in highly advanced devices.

A skilled man can control the ratio of X/Y by optionally and selectively determining a volume ratio of components of the hydrochloric acid-hydrogen peroxide mixture, a temperature of the hydrochloric acid-hydrogen peroxide mixture, provision of the bubble-trapping means, an amount of circulating hydrochloric acid-hydrogen peroxide mixture, and the like.

Hereinafter, the present invention is explained by Examples but is not limited thereto. Particularly, in order to clarify the difference in the number of adhered micro particles, the treatment (dipping) was carried out for a longer time in Examples than a usual treatment time (approximately 5 minutes). Of course, the treating time is not limited to those in Example.

It is also noted that the "micro particles" used in the present specification are micro particles such as silicon and silicon oxide, and have a size of approximately 0.01 to 0.5 $\mu$m.

EXAMPLE 1

With the cleaning system shown in FIG. 1, the method of the present invention was carried out by dipping for 30 minutes a silicon wafer of 8 inches into the hydrochloric acid-hydrogen peroxide mixture (36 wt % aqueous hydrochloric acid solution: 30 wt % aqueous hydrogen peroxide solution: water=1:1:5 (volume ratio)) having a temperature shown in Table 1. It was noted that the bubble-trapping means was not provided. The pressure in the cleaning bath was the atmospheric pressure.

Then, every edge portion of the wafer was trimmed by 8 mm and the number of adhered micro particles of not smaller than 0.1 $\mu$m on the trimmed silicon wafer was detected by using a micro particle detecting machine (machine for detecting micro particles adhered to the surface of wafer by irradiating laser beam and observing diffused light of the laser). The results are shown in Table 1.

Comparative Example 1

The same cleaning procedures as in Example 1 were repeated except that the temperature of the hydrochloric acid-hydrogen peroxide mixture was changed to 15° C., 50° C. or 75° C. and the number of micro particles of not smaller than 0.1 $\mu$m adhered on the cleaned wafer was detected in the same manner as in Example 1. The results are shown in Table 1.

TABLE 1

|  | Example 1 | | | | | | Com. Ex. 1 | | |
| --- | --- | --- | --- | --- | --- | --- | --- | --- | --- |
|  | No. 1 | No. 2 | No. 3 | No. 4 | No. 5 | No. 6 | No. 1 | No. 2 | No. 3 |
| Temperature of HPM*) (° C.) | 20 | 25 | 30 | 35 | 40 | 45 | 15 | 50 | 75 |
| Number of micro particles | 3 | 2 | 6 | 7 | 9 | 12 | 4 | 66 | 136 |

*) Hydrochloric acid-hydrogen peroxide mixture

From Table 1, it is recognized that the number of adhered micro particles is remarkably increased as a function of the temperature of the hydrochloric acid-hydrogen peroxide mixture in case of higher than 45° C.

EXAMPLE 2

The same cleaning procedures as in Example 1 were repeated except that the typical and simple bubble-trapping means 6 shown in FIG. 3 was provided between the filter 5 and supplying port 7 and the temperature of the hydrochloric acid-hydrogen peroxide mixture was maintained at 40° C., and the number of micro particles of not smaller than 0.1 $\mu$m adhered on the cleaned wafer of 8 inches was detected in the same manner as in Example 1.

Table 2 shows the relation between period of time after changing all of the hydrochloric acid-hydrogen peroxide mixture in the cleaning bath, the outside bath and the piping and the number of micro particles of not smaller than 0.1 $\mu$m adhered on the cleaned silicon wafer. Further, the same experiment was repeated without the bubble-trapping means and the results also are shown in Table 2.

TABLE 2

|  | Time after changing HPM (hr) | | | | | | |
| --- | --- | --- | --- | --- | --- | --- | --- |
|  | 0 | 1 | 2 | 3 | 22 | 23 | 24 |
| Number of remaining micro particles | | | | | | | |
| With bubble-trapping means | 10 | 4 | 1 | 2 | 1 | 2 | 2 |
| Without bubble-trapping means | 29 | 17 | 9 | 10 | 8 | 9 | 10 |

From Table 2, it is recognized that the number of the adhered micro particles is less at every period of time when the bubble-trapping means is provided.

EXAMPLE 3

The same cleaning procedures as in Example 1 were repeated except that the temperature of the hydrochloric acid-hydrogen peroxide mixture was maintained at 45° C. and the pressure in the cleaning bath was changed to 1 atm, 2 atm, 3 atm or 4 atm by using $N_2$ gas, and the number of micro particles of not smaller than 0.1 $\mu$m adhered on the cleaned wafer of 8 inches was detected in the same manner as in Example 1.

Table 3 shows the relation between the pressure in the cleaning bath and the number of micro particles of not smaller than 0.1 $\mu$m adhered on the cleaned silicon wafer.

TABLE 3

|  | Pressure in the cleaning bath (atm) | | | |
| --- | --- | --- | --- | --- |
|  | 1 | 2 | 3 | 4 |
| Number of micro particles | 8 | 0 | 0 | 0 |

From Table 3, it is recognized that the number of adhered micro particles is less when the pressure is increased.

EXAMPLE 4

The same cleaning procedures as in Example 1 were repeated except that the dipping time of the member to be cleaned was set to 60 minutes and the amount (Y) of the hydrochloric acid-hydrogen peroxide mixture in the cleaning bath was 30 liter, and the number of micro particles of not smaller than 0.1 μm adhered on the cleaned wafer of 8 inches was detected in the same manner as in Example 1.

In this experiment, the upper portions of both of the cleaning bath and the outside bath were sealed with lids having a through hole. And, the volume (X) of bubbles generated per minute during the dipping of the wafer in the hydrochloric acid-hydrogen peroxide mixture was calculated from a total amount of gas collected during 60 minutes.

Table 4 shows the relation between the ratio of X/Y and the number of micro particles of not smaller than 0.1 μm adhered on the cleaned silicon wafer.

TABLE 4

| | Value of X/Y | | | | |
|---|---|---|---|---|---|
| | 0.02 | 0.05 | 0.1 | 0.15 | 0.2 |
| Number of micro particles | 3 | 7 | 16 | 73 | 158 |

From Table 4, it is recognized that the number of adhered micro particles on the wafer is increased as the ratio of X/Y is increased and the number of adhered micro particles is remarkably increased when the ratio of X/Y is increased beyond 0.1.

Industrial Applicability

According to the present invention, by controlling the temperature of the hydrochloric acid-hydrogen peroxide mixture within the range of 20° to 45° C., an amount of generation of bubbles can be decreased and the adhesion of micro particles on the member to be cleaned such as wafer can be inhibited without decreasing performance of the hydrochloric acid-hydrogen peroxide mixture to remove metallic impurities.

According to the present invention, by providing the bubble-trapping means at least between the filter and the supplying port and by controlling the temperature of the hydrochloric acid-hydrogen peroxide mixture within the range of 20° to 45° C., an amount of generation of bubbles can be further decreased and the adhesion of micro particles onto the member to be cleaned such as wafer can be further inhibited. And a smaller bubble-trapping means can be used.

According to the present invention, by controlling the pressure in the cleaning bath to not less than 1 atm, an amount of generation of bubbles can be further decreased and the adhesion of micro particles onto the member to be cleaned such as wafer can be further inhibited.

According to the present invention, by controlling the ratio of X/Y to a ratio of not higher than 0.1, in which X and Y are as defined above, an amount of generation of bubbles can be decreased and the adhesion of micro particles onto the member to be cleaned such as wafer can be inhibited.

What we claim is:

1. A method for cleaning a member, comprising supplying into a cleaning bath a mixture comprising hydrochloric acid, hydrogen peroxide and water through a filter and a supplying port, and dipping the member in the cleaning bath, wherein the temperature of the mixture during the dipping is controlled within the range of from 20° to 45° C., and wherein bubbles are generated in the mixture, wherein the pressure in the cleaning bath is greater than 1 atmosphere, and wherein a ratio of X/Y is not higher than 0.1, wherein X is a total volume of the bubbles generated per minute in the cleaning bath while the member to be cleaned is dipped in the cleaning bath and Y is the volume of the mixture in the cleaning bath.

2. The method of claim 1, further comprising trapping the bubbles with a bubble trap disposed between the filter and the supplying port.

3. The method of claim 1, wherein the temperature of the mixture during the dipping is controlled within the range of from 40 to 45° C.

4. A method for cleaning a member, comprising supplying into a cleaning bath a mixture comprising hydrochloric acid, hydrogen peroxide and water through a filter and a supplying port, and dipping the member in the cleaning bath, wherein the temperature of the mixture during the dipping the controlled within the range of from 20° to 45° C., and bubbles are generated in the mixture, and a ratio of X/Y is not higher than 0.1, wherein X is a total volume of the bubbles generated per minute in the cleaning bath while the member to be cleaned is dipped in the cleaning bath, and Y is the volume of the mixture in the cleaning bath.

* * * * *